United States Patent
Davis

(10) Patent No.: US 9,674,990 B2
(45) Date of Patent: Jun. 6, 2017

(54) DEVICES AND METHODS FOR COOLING BUS CAPACITORS

(71) Applicant: Leonard J Davis, Asheville, NC (US)

(72) Inventor: Leonard J Davis, Asheville, NC (US)

(73) Assignee: Rockwell Automation Technoloies, Inc., Mayfield Heights, OH (US)

( * ) Notice: Subject to any disclaimer, the term of this patent is extended or adjusted under 35 U.S.C. 154(b) by 83 days.

(21) Appl. No.: 14/603,707

(22) Filed: Jan. 23, 2015

(65) Prior Publication Data

US 2016/0219750 A1    Jul. 28, 2016

(51) Int. Cl.
| | |
|---|---|
| H05K 7/20 | (2006.01) |
| H01G 2/08 | (2006.01) |
| H01G 4/38 | (2006.01) |
| H01G 2/10 | (2006.01) |
| H01L 23/473 | (2006.01) |

(52) U.S. Cl.
CPC .............. *H05K 7/209* (2013.01); *H01G 2/08* (2013.01); *H01G 2/106* (2013.01); *H01G 4/38* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,490,162 | B2 * | 12/2002 | Siu ...................... | H01L 23/4093 174/548 |
| 2001/0030037 | A1 * | 10/2001 | Hellbruck ........... | H01L 23/4093 165/80.3 |
| 2004/0109293 | A1 * | 6/2004 | Apfelbacher ........ | H01H 50/021 361/709 |

(Continued)

FOREIGN PATENT DOCUMENTS

DE      102011088043 A1    6/2013

OTHER PUBLICATIONS

EPO; Extended European Search Report and Written Opinion; EP 16152361.8; dated Jun. 2, 2016.

*Primary Examiner* — Anthony Haughton
*Assistant Examiner* — Razmeen Gafur
(74) *Attorney, Agent, or Firm* — Quarles & Brady LLP

(57) ABSTRACT

An apparatus for cooling power components includes a first clamping portion, the first clamping portion having a first arcuate engagement surface, and a first interface. A second clamping portion, the second clamping portion having a second arcuate engagement surface, and a second interface. A flexible heat transfer pad and a power component. The power component is coupled to the flexible heat transfer pad, such that the flexible heat transfer pad substantially surrounds the power component, the first clamping portion and the second clamping portion configured to be coupled, such that the first arcuate engagement surface and the second arcuate engagement surface form an opening contoured to receive the power component, and the first interface and the second interface are adjacent to each other.

15 Claims, 5 Drawing Sheets

(56) References Cited

U.S. PATENT DOCUMENTS

| | | | |
|---|---|---|---|
| 2004/0246662 A1* | 12/2004 | Thurk | H02M 1/44 361/631 |
| 2005/0135065 A1* | 6/2005 | Nakatsu | H01L 23/4006 361/703 |
| 2006/0039127 A1* | 2/2006 | West | H02M 7/003 361/803 |
| 2007/0025087 A1* | 2/2007 | Chen | H05K 7/209 361/704 |
| 2007/0062673 A1* | 3/2007 | Olesen | F28F 3/12 165/80.4 |
| 2007/0097627 A1* | 5/2007 | Taylor | H05K 7/20927 361/689 |
| 2007/0133180 A1* | 6/2007 | Nilson | H05K 7/209 361/720 |
| 2007/0165376 A1* | 7/2007 | Bones | H01L 25/162 361/688 |
| 2007/0236883 A1* | 10/2007 | Ruiz | H01L 23/473 361/699 |
| 2008/0158822 A1* | 7/2008 | Stolze | H01L 23/049 361/704 |
| 2008/0198548 A1* | 8/2008 | Nakamura | H05K 7/20927 361/689 |
| 2008/0265586 A1 | 10/2008 | Like et al. | |
| 2008/0298014 A1* | 12/2008 | Franco | G06F 1/183 361/688 |
| 2008/0310120 A1* | 12/2008 | Wallrafen | H01L 23/3672 361/720 |
| 2009/0225512 A1* | 9/2009 | Visser | H05K 7/20872 361/699 |
| 2009/0284930 A1* | 11/2009 | Ice | H05K 7/20418 361/715 |
| 2011/0002079 A1 | 1/2011 | Jakoubovitch | |
| 2011/0090614 A1 | 4/2011 | Guerin et al. | |
| 2011/0194250 A1* | 8/2011 | Perkins, III | H05K 7/1434 361/690 |
| 2012/0050999 A1* | 3/2012 | Cooper | H02M 7/003 361/722 |
| 2012/0262877 A1 | 10/2012 | Nagano et al. | |
| 2013/0176679 A1* | 7/2013 | Anderl | H01L 23/4093 361/679.47 |
| 2013/0294032 A1* | 11/2013 | Stella | H01L 23/367 361/718 |
| 2014/0247554 A1* | 9/2014 | Sharma | H05K 7/1432 361/695 |
| 2014/0374395 A1* | 12/2014 | Dunahoo | B23K 9/1006 219/130.1 |
| 2015/0075761 A1* | 3/2015 | Hancock | B23P 15/26 165/181 |

* cited by examiner

DEVICES AND METHODS FOR COOLING BUS CAPACITORS

CROSS-REFERENCE TO RELATED APPLICATIONS

Not Applicable

STATEMENT REGARDING FEDERALLY SPONSORED RESEARCH OR DEVELOPMENT

Not applicable.

BACKGROUND OF THE INVENTION

The subject matter disclosed within generally relates to industrial control systems, and more particularly to systems and methods that provide cooling mechanisms for power components associated with industrial control systems.

Industrial control systems, by their nature, are located in a variety of environments. Some of these environments can have a variety of air-born contaminates that can be damaging to electrical components. Alternatively, certain environments may require regular cleaning with water and/or other chemicals which can also damage sensitive electrical and power components. Further, some environments may require pressure washing, requiring electrical enclosures to prevent liquids from contacting the electrical components, causing damage or dangerous situations. Thus, installation of industrial control systems in environments containing potential contaminates can require specialized installation systems to protect the electrical components.

When industrial control systems are installed in environments where they are required to be isolated from potential contaminates, the electrical components are often placed in an enclosure. These enclosures, depending on the level of sealing necessary, can be designed to prevent the ingress of liquids, or, in certain situations, from the outside air in general. As these sealed enclosures are generally more expensive than standard electrical enclosures, they are often sized to accommodate multiple components such that the number of enclosures needed can be reduced. This often results in long cabling and conduit runs to and from various equipment and processes; thereby increasing both cost and complexity to a system.

Additionally, the sealed nature of these enclosures required them to, generally, be larger than non-sealed enclosures in order to accommodate the heat generated by the internal electrical components. As the enclosures can be required to be sealed from the outside air, efficient cooling of the internal electrical components is difficult and often requires significant oversizing of the enclosure to ensure that the heat can be adequately dissipated. This additional size further increases material cost of the enclosures and requires more of the industrial environment real estate be allocated for these enclosures. This inefficient use of space can have a significant impact on the efficiency and utilization of the industrial environment in addition to requiring additional capital for the materials and installation.

Passive heat dissipation devices such as heat sinks can be used to dissipate heat produced by the components. Additionally, heat sinks can be used in conjunction with an active cooling device such as a stirring fan, or, where feasible, used in lieu of an active cooling device. Heat sinks require additional space in the enclosure and sufficient air volume to effectively dissipate the generated heat. Further, heat sinks can be difficult to apply to certain power components due to their geometrical features. A prime example are power capacitors, such as those used as bus capacitors for variable frequency drives. These devices are often cylindrical and, in some instances, fragile. Attempts at removing heat from power capacitors with a heat sink can be difficult as heat sinks rely on a thermally efficient coupling to the device to properly dissipate heat from the component. Thermally efficient coupling is generally accomplished by placing as much of the component as possible in contact with the heat sink with a tight physical connection to ensure heat can easily transfer from the component to the heat sink.

Generally, components are connected to a heat sink on a substantially flat portion of the component to allow for the greatest surface area to be in contact with the heat sink. These substantially flat surfaces are also generally the strongest portions of the components, allowing for a strong coupling between the component and the heat sink. However, capacitors, and particularly power capacitors, are generally cylindrical in shape, thereby making it difficult to couple a heat sink to the capacitor. Further, cylindrical capacitors can be easily deformed with little force. Deformation of the power capacitors can affect the properties of the capacitor adversely, even causing failures, which can result in unplanned downtime to repair. This is made more complicated by the non-uniformity of many power capacitors, making it difficult to produce a heat sink that can couple to the power capacitor to allow for efficient cooling while preventing any physical deformation or damage to the power capacitor.

Thus, it would be advantageous to have devices and methods that allows for a heat sink to be safely and efficiently coupled to a power component, such as a capacitor, to efficiently cool the power component while reducing the likelihood of physical damage to the power component.

BRIEF SUMMARY OF THE INVENTION

An embodiment of an apparatus for cooling power components includes a first clamping portion, the first clamping portion having a first arcuate engagement surface, and a first interface. A second clamping portion, the second clamping portion having a second arcuate engagement surface, and a second interface. A flexible heat transfer pad and a power component. The power component is coupled to the flexible heat transfer pad, such that the flexible heat transfer pad substantially surrounds the power component, the first clamping portion and the second clamping portion configured to be coupled, such that the first arcuate engagement surface and the second arcuate engagement surface form an opening contoured to receive the power component, and the first interface and the second interface are adjacent to each other.

An embodiment of a method of cooling power components includes surrounding a power component with a flexible heat transfer pad, locating the power component adjacent to a first arcuate engagement surface of a first clamping portion, coupling a second clamping portion to the first clamping portion having a first arcuate engagement surface, the first arcuate engagement surface and the second arcuate engagement surface engaging the flexible heat transfer pad, and securing the first clamping portion to the second clamping portion to clamp the power component and the flexible heat transfer pad using a fastening device.

An embodiment of a power capacitor heat-dissipating clamping device includes a first clamping portion integrally formed with a heat sink, the first clamping portion having a first generally arcuate engagement surface, and a first interface. A second clamping portion, the second clamping portion having a second generally arcuate engagement surface, and a second interface. A flexible heat transfer pad, and a cylindrical power component. The power component is coupled to the flexible heat transfer pad, such that the flexible heat transfer pad substantially surrounds the power component, the first clamping portion and the second clamping portion configured to be coupled, such that the first arcuate engagement surface and the second arcuate engagement surface form an opening contoured to receive the power component, and the first interface and second interface are adjacent to each other.

BRIEF DESCRIPTION OF THE SEVERAL VIEWS OF THE DRAWINGS

The invention will hereafter be described with reference to the accompanying drawings, wherein like reference numerals denote like elements, and.

DETAILED DESCRIPTION OF THE INVENTION

Figure 1:
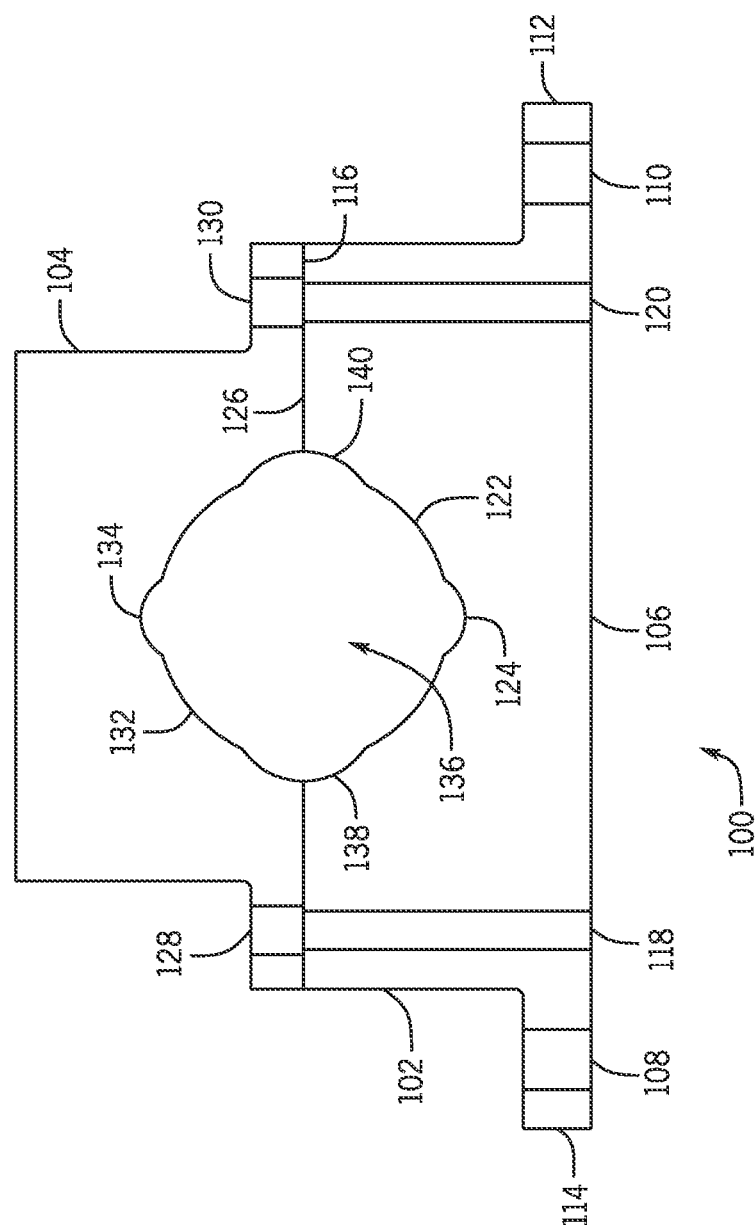
FIG. 1 illustrates a front-view of an example embodiment of a power component clamping assembly.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

FIG. 1 illustrates a possible embodiment of a power component clamping device 100. The single component clamping device 100 can have a lower portion 102 and an upper portion 104. Lower portion 102 and upper portion 104 can be machined metal. In one embodiment, lower portion 102 and upper portion 104 can be casted metal. Additionally, other suitable methods of manufacture as known in the art can be used, such as metal injection molding (MIM), stamping, etc. Lower portion 102 and upper portion 104 can be formed of a metal or metal alloy having thermal and electrical conductivity. Non-limiting examples include steel, aluminum and copper. In a preferred embodiment, lower portion 102 and upper portion 104 can be made of the same material in order to ensure consistent thermal expansion and contraction between the upper portion 104 and the lower portion 102.

Lower portion 102 can have a substantially flat lower surface 106 that can be used to mount lower portion 102 to a corresponding surface. In one embodiment, the corresponding surface can be a heat sink. The lower portion 102 can further have a plurality of attachment points 108, 110 for coupling the lower portion 102 to a corresponding surface. The plurality of attachment points 108, 110 can be through holes which allow for a fastener device to be used to allow for fastening devices to be passed through. Additionally, attachment points 108, 110 can be threaded through holes which allow for threaded fasteners to couple lower portion 102 to a corresponding surface. Lower portion 102 can also feature extended mounting tabs 112, 114. Attachment points 108, 110 can be located on mounting tabs 112, 114 as illustrated in FIG. 1. Alternatively, mounting tabs 112, 114 can be used as a clamping point to allow for lower portion 102 to be clamped to a corresponding surface. Lower portion 102 can further have a substantially flat upper surface 116. Lower portion 102 can also have a plurality of coupling apertures 118, 120. A plurality of lower coupling apertures 118, 120 can extend along a plane that is substantially perpendicular to the lower surface 106 and the upper surface 116. In one embodiment, the plurality of lower coupling apertures 118, 120 can extend from the upper surface 116 to the lower surface 106. Alternatively, the plurality of lower coupling apertures 118, 120 can extend a fixed distance between the upper surface 116 and the lower surface 106. In one embodiment, the plurality of lower coupling apertures can be threaded. Lower portion 102 can also have a generally arcuate lower clamping feature 122 that extends along a plane substantially parallel to the upper surface 116. In one embodiment, the lower clamping feature 122 can have a lower relief portion 124. In one embodiment, the lower relief portion 124 can have an arcuate shape.

Upper portion 104 can have a mounting surface 126. Mounting surface 126 can be shaped to couple to upper surface 116 of the lower portion 102. In one embodiment, mounting surface 126 can be substantially flat to couple flush to upper surface 116. Upper portion 104 can have a plurality of upper coupling apertures 128, 130 that can extend along a plane that is substantially perpendicular to the mounting surface 126. Upper coupling apertures 128, 130 can be positioned to align with lower coupling apertures 118, 120 to allow for a fastener to be inserted through upper coupling apertures 128, 130 and respective lower coupling apertures 118, 120. Upper coupling apertures 128, 130 can have the same diameter of lower coupling apertures 118, 120. Alternatively, upper coupling apertures 128, 130 can have a slightly larger diameter than lower coupling apertures 118, 120 to allow for production tolerances. In one embodiment, upper coupling apertures 128, 130 may have about a 5% to about a 20% larger diameter than lower coupling apertures 118, 120. Upper portion 104 can have a generally arcuate upper clamping feature 132 that extends along a plane substantially parallel to the mounting surface 126. Upper clamping feature 132 can have an upper relief portion 134. In a preferred embodiment, the upper clamping feature 132 can mirror the lower clamping feature 122.

When the lower portion 102 and upper portion 104 are coupled, the lower clamping feature 124 and the upper clamping feature 134 can form a generally circular clamping aperture 136. In some embodiments, when lower portion 102 and upper portion 104 are coupled, they can form a plurality of side relief features 138, 140. Side relief features 138, 140 can positioned at about ninety-degrees from the lower relief feature 124 and the upper relief feature 134, although other positions are contemplated.

Figure 2:
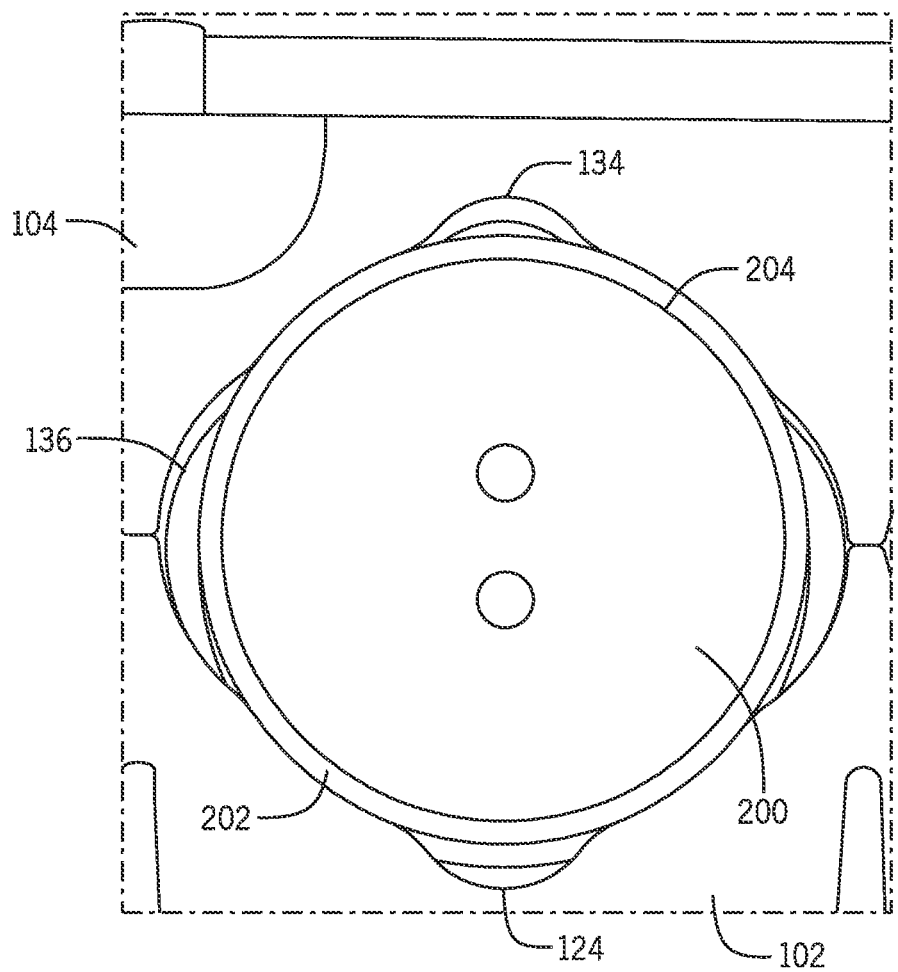
FIG. 2 is a magnified view of an embodiment of the power component clamping assembly.

Turning now to FIG. 2, a magnified view of the clamping aperture 136 can be seen. Clamping aperture 136 can receive a power component 200. In one embodiment, the power component 200 can be cylindrical in shape. In a specific embodiment, the power component 200 can be a capacitor. Generally, the clamping aperture 136 can be contoured to receive a power component. Capacitors, including power capacitors, can come in a variety of sizes. In one embodiment, the power component clamping device 100 can clamp capacitors having a diameter of about 22 mm to about 35 mm. However, the clamping apertures can be size to accommodate capacitors having diameters less than 22 mm and more than 35 mm. Additionally, the power component clamping device 100 can clamp any type of cylindrical capacitor. Further, it should be known that the representations of capacitors shown in the various figures are for illustrative purposes only and should not be considered limiting.

Continuing with FIG. 2, the power component 200 can be seen located in the clamping aperture 136 between the lower portion 102 and the upper portion 104. In one embodiment, the power component 200 can be partially or completely surrounded by a dielectric insulator 202. In one embodiment, the dielectric insulator 202 can be an adhesive tape that surrounds power component 200. Alternatively, the dielectric insulator 202 can be a dielectric film, such as a polyimide film that can be applied to the power component 200. The dielectric insulator can have a thickness of about 1 Mil to about 5 Mils, or more or less. The dielectric insulator 202 can have an electrical insulation rating of about 600 volts to about 1000 volts. However, in certain applications, the dielectric insulator 202 may require an electrical insulation rating of more than 1000 volts.

The power component 200 can also be surrounded by a conformable, thermally conductive material, such as thermal pad 204. Thermal pad 204 can be used to prevent air gaps between the power component 200 and the power component clamping device 100 to maximize thermal conductivity. Thus, thermal pad 204 can be used to efficiently transfer heat from the power component to the clamping device 100. In one embodiment, thermal pad 204 can have a thermal conductivity of about 1.0 W/m-k, or more or less. Thermal pad 204 can have a thickness of about 0.508 mm to about 6.350 mm, or more or less. In a preferred embodiment, the thermal pad 204 can have a thickness of about 2.0 mm. Thermal pad 204 can have an adhesive like tack on one or both sides for reducing movement of the thermal pad 204 once put into place. Alternatively, thermal pad 204 can be attached to a power component 200 using an adhesive applied to the thermal pad 204 and power component 200. In other embodiments, the thermal pad 204 can be held in place by compressing the thermal pad 204 against the power component 200 in the clamping aperture 136. Thermal pad 204 can have a conformable construction such that compression can be applied to the thermal pad 204 without significant pressure being applied to the power component 200. Thermal pad 204 can have a flexible structure to allow it to be formed around the power component 200.

FIG. 2 shows the thermal pad 204 surrounding power component 200 and compressed by upper portion 104 and lower portion 102. When thermal pad 204 is compressed, the conformable construction can cause the thermal pad 204 to move and fill in the spaces in the lower relief feature 124, upper relief feature 134 and side relief features 138, 140 of the clamping aperture 136. Allowing the thermal pad 204 to expand into the plurality of relief features 124, 134, 138, 140 can allow the power component to be secured in the clamping aperture 136 while reducing the pressure placed on the power component from the compression between upper portion 104 and lower portion 102. This can be critical when attempting to create a thermal connection to an electrical component such as a capacitor without damaging the structural integrity of the device.

Returning briefly to FIG. 1, the clamping aperture 136 can have a diameter which can be about 5% to about 10% larger than the diameter of the power component 200 that is to be located in the in the clamping aperture. However, clamping aperture 136 diameter can be more than 10% or less than 5% of the diameter of the power component 200 as needed. Upper relief aperture 134 and lower relief aperture 124 can each have a diameter of about 30% to about 40% of the diameter of the power component 200. Side relief apertures 138, 140 can have a diameter of about 50% to about 60% of the diameter of the power component 200.

Figure 3:
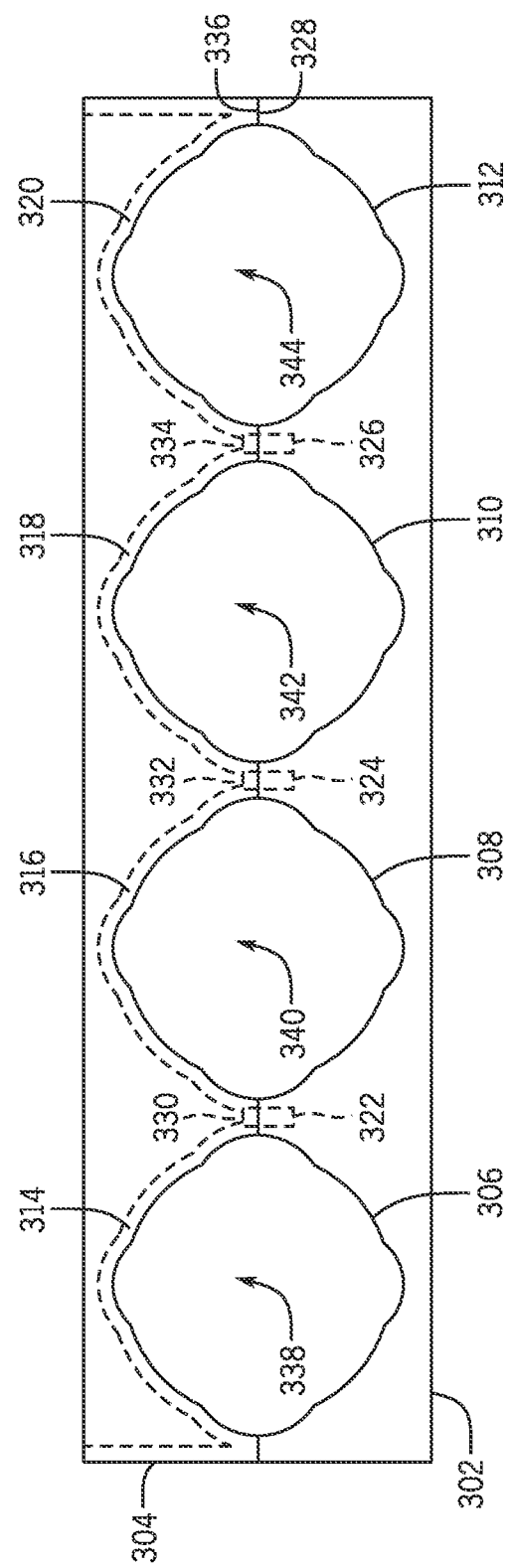
FIG. 3 is a front-view of an embodiment of a multiple power component clamping assembly.

Turning now to FIG. 3, a multiple power component clamping device 300 can be seen. The multiple power component clamping device 300 has a lower portion 302 and an upper portion 304. Lower portion 302 can include a plurality of generally arcuate lower clamping features 306, 308, 310, 312. Upper portion 304 can include a plurality of substantially actuate upper clamping features 314, 316, 318, 320. Lower portion 302 can have a plurality of coupling apertures 322, 324, 326 that extend along a plane that is substantially perpendicular to a lower mounting surface 328. Upper portion 304 can have a plurality of upper coupling apertures 330, 332, 334 which can extend along a plane that is substantially perpendicular to the mounting surface 336. Upper coupling apertures 330, 332, 334 can be positioned to align with lower coupling apertures 322, 324, 326 to allow for a fastener to be inserted through upper coupling apertures 330, 332, 334 and respective lower coupling apertures 322, 324, 326, to couple the lower portion 302 to the upper portion 304.

When the lower portion 302 and upper portion 304 are coupled, the lower clamping features 306, 308, 310, 312 and the upper clamping features 314, 316, 318, 320 can form a plurality of substantially circular clamping apertures 338, 340, 342, 344. Each of circular clamping apertures 338, 340, 342, 344 can each include a lower relief feature, an upper relief feature, and side relief features as shown in FIG. 1. Further, clamping apertures 338, 340, 342, 344 can be dimensioned similarly to the single clamping aperture 136 of FIG. 1. While the multiple power component clamping device 300 is shown in FIG. 3 to have four clamping apertures 338, 340, 342, 344, it should be known that the disclosed multiple power component clamping device 300 can have more than four clamping apertures or less than four clamping apertures.

Figure 4:
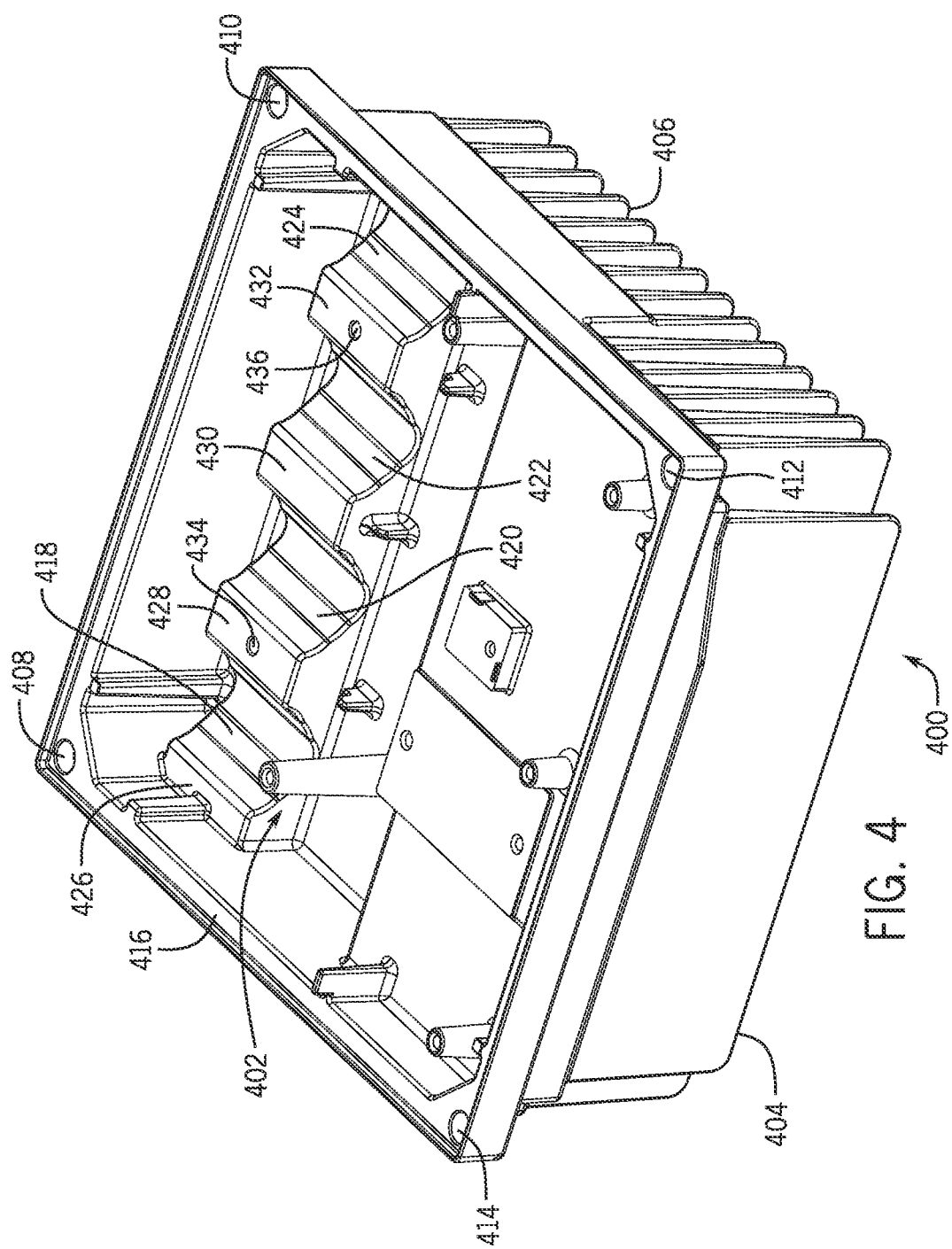
FIG. 4 is an isometric view of an embodiment of an integrated heat sink clamping device.

Another embodiment of a power component clamping device can be seen in FIG. 4. FIG. 4 shows an integrated heat sink clamping device 400. In this embodiment, a lower clamping portion 402 can be integrally formed into a heat sink assembly 404. In one embodiment, the lower clamping portion 402 and the heat sink assembly 404 can be cast into a single assembly. In an alternate embodiment, the lower clamping portion 402 and the heat sink assembly 404 can be machined to form the integrated heat sink clamping device 400. In one embodiment, the heat sink clamping device can be constructed using an aluminum alloy. While various types of materials can be used in the construction of the heat sink clamping device, materials should be selected with sufficient thermal resistance to dissipate the heat generated by the power components. In a preferred embodiment, the heat sink clamping device 402 should have a thermal resistance (measured between a power component and where the lower clamping portion 402 meets the heat sink assembly 404) of 1° C./W or better.

The heat sink 404 can have a plurality of fins 406 for increasing the surface area of the heat sink 404 and thereby increasing the thermal efficiency of the heat sink. In some embodiments, the clamp and heat sink can dissipate up to twice the amount of the heat generated in the capacitors compared to free convection cooling. This can eliminate the need for active cooling (e.g. forced air movement) of the power components. While heat sink 404 shows a straight finned heat sink design, other types of heat sink designs can be used in the heat sink clamping device 400. For example, pin, flared, or other fin designs can be used as applicable.

Heat sink clamping device 400 can have a plurality of openings 408, 410, 412, 414 for coupling the heat sink clamping device 400 to a separate structure. In one embodiment, the separate structure can be an electrical enclosure. Alternatively, the separate structure could be a piece of equipment or machine. The heat sink clamping device 400 can further have a substantially flat mounting surface 416 for providing a flush fit with a separate structure. In one embodiment, a gasket (not shown) can be applied to the substantially flat mounting surface 416 to provide a seal between the heat sink clamping device 400 and a separate structure. The gasket can be a formed gasket, such as those made of rubber or form type materials. Alternatively, the gasket can be in the form of a liquid gasket such as silicon. The gasket can be selected to achieve a specific environmental rating. In one embodiment, gasketing can be used to achieve a NEMA 4/4x environmental rating.

The lower clamping portion 402 can be integrally formed into the heat sink clamping device 400 as shown in FIG. 4. The lower clamping portion 402 can have a plurality of lower clamping features 418, 420, 424, 424. In one embodiment, the lower clamping portion 402 may have four clamping features; however, it should be known that the lower clamping portion 402 can have more than four clamping features or less than four clamping features. Lower clamping portion 402 can have a plurality of substantially flat mating surfaces 426, 428, 430, 432. Mating surfaces 426, 428, 430, 432 can be sized to mate with corresponding mating surfaces on an upper clamping portion discussed later. One or more of the mating surfaces 426, 428, 430, 432 can have one or more lower coupling apertures 434, 436. In one embodiment, the lower coupling apertures can be threaded. Alternatively, the one or more mating surfaces 426, 428, 430, 432 can have other coupling mechanisms, such as threaded rods, tongue and groove features, etc.

Figure 5:
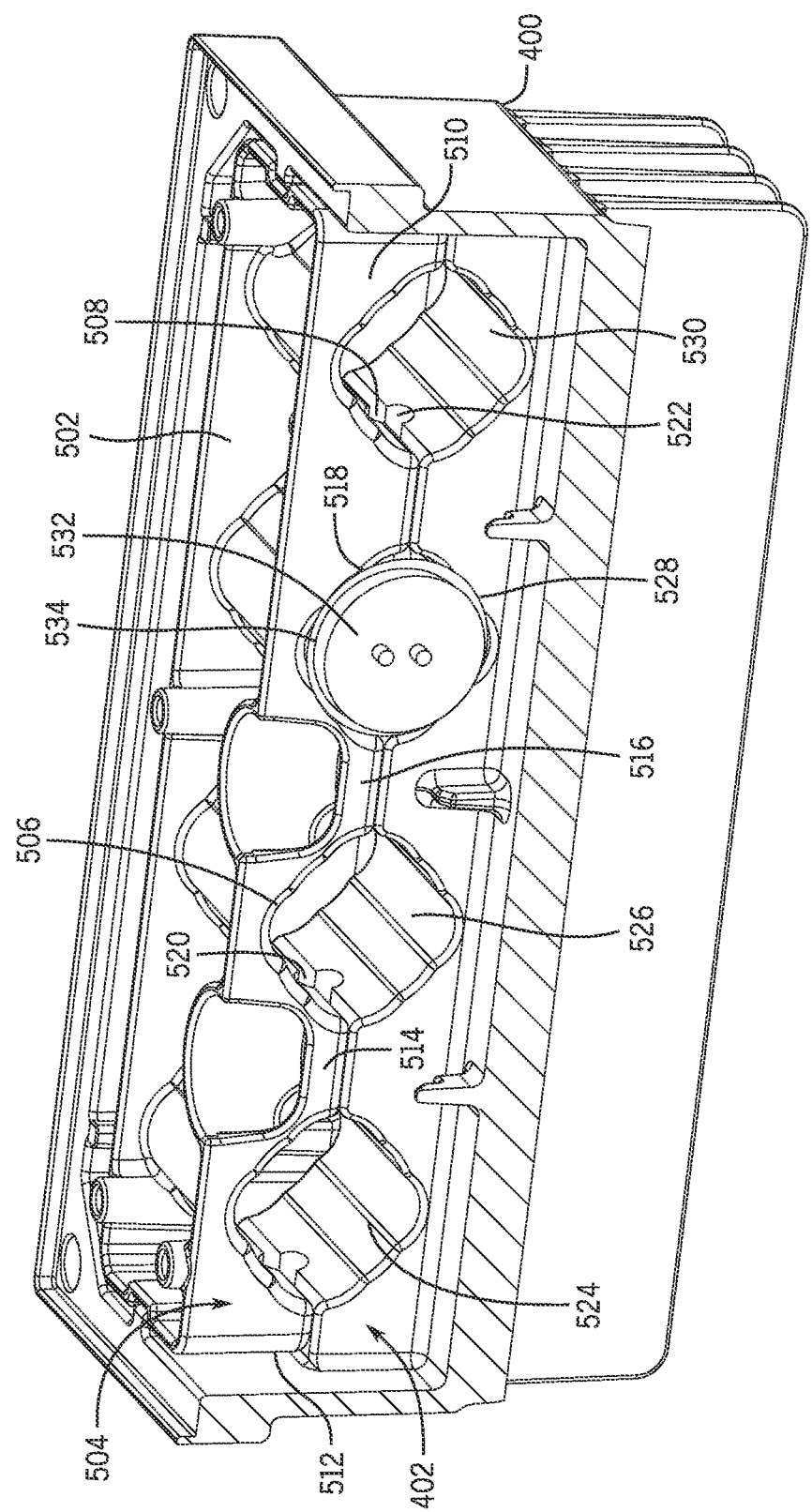
FIG. 5 is a cross-sectional isometric view of an embodiment of an integrated heat sink clamping device.

Turning to FIG. 5, a cut-away view of the heat sink clamping device 400 can be seen. An upper coupling portion 502 can be coupled to lower clamping portion 402. Upper coupling portion 502 can have a plurality of upper clamping features 504, 506, 508, 510. The upper clamping portion 502 can have a number of upper clamping features that correspond to the number of lower clamping features on the lower clamping portion 402. Upper clamping portion 502 can have a plurality of substantially flat mating surfaces 512, 514, 516, 518 that correspond to mating surfaces 426, 428, 430, 432 on the lower coupling portion 402. One or more of the mating surfaces 512, 514, 516, 518 can have one or more upper coupling apertures 520, 522. In one embodiment, the upper coupling apertures 520, 522 can be threaded. Alternatively, the one or more mating surfaces 512, 514, 516, 518 can have other coupling mechanisms, such as threaded rods, tongue and groove features, etc.

When the lower portion 402 and upper portion 502 are coupled, the lower clamping features 418, 420, 422, 424 and the upper clamping features 504, 506, 508, 510 can form a plurality of substantially circular clamping apertures 524, 526, 528, 530. Each of circular clamping apertures 524, 526, 528, 530 can each include a lower relief feature, an upper relief feature, and side relief features as shown in FIG. 1. Further, clamping apertures 524, 526, 528, 530 can be dimensioned similarly to the single clamping aperture 136 of FIG. 1.

FIG. 5 further shows a power component 532 located in clamping aperture 528. Power component 532 is surrounded by thermal pad 534. This provides an exemplary illustration of clamping a power component 532 using the heat sink clamping device 400.

The power component 532 can be clamped into the heat sink clamping device 400 using a variety of methods. In one preferred method, the power component 532 is first wrapped with a di-electric tape (not shown) and then further surrounded by the thermal pad 534. The power component 532 can then be placed into a lower clamping feature 422 of the lower clamping portion 402 such that the thermal pad 534 contacts the lower clamping feature 422 for the length of the power component 532, or a portion thereof. This step can be repeated for each power component 532 that is installed in the lower clamping portion 402. Once all of the power components 532 are placed in the lower clamping portion 402, the upper clamping portion 504 can be coupled to the lower clamping portion 402. In one embodiment, fastening devices can be used to couple the lower clamping portion 402 to the upper clamping portion 504 extending through the upper coupling apertures 520, 522 and into the lower coupling apertures 434, 436. The heat sink clamping device 400 can then be coupled to a separate structure.

In use, the heat sink clamping device 400 can be used to improve cooling in electrical enclosures. In one example, the heat sink clamping device 400 can be used to cool power components such as bus capacitors in an enclosed variable speed drive application. Additionally, modular enclosures, those allowing portions of an industrial control system to be positioned near to the equipment or processes they control, can specifically benefit from heat sink clamping device 400. One such system, for example, is the Rockwell Automation ArmorStart product line. These modular enclosures can contain industrial control components such as controllers, variable speed drives, motor starters, etc., which can all generate heat. Additionally, these types of modular enclosures can be sealed against outside contaminates to various degrees. For example, modular enclosures can be constructed with NEMA, or equivalent, ratings such as NEMA 3x or NEMA 4/4R. The heat generated by the internal industrial control components can be difficult to dissipate in a sealed enclosure; particularly power electrical power components, such as those found in a variable frequency drive. For example, power components such as the bus capacitors in a variable speed drive can put off significant heat that requires dissipation. Failure to effectively cool these components can reduce their effective life. To increase the efficiency in dissipate heat from components in sealed modular enclosures, active cooling devices, such as stirring fans, can be used to provide airflow over components to remove heat. However, stirring fans, and fans in general, are susceptible to malfunctions. However, the heat sink clamping device 400 can be used to more efficiently remove heat from these power components, and can thereby reduce or eliminate the need for active cooling devices, such as stirring fans.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus for cooling power components comprising:
   a first clamping portion, the first clamping portion having a first arcuate engagement surface, and a first interface;
   a second clamping portion, the second clamping portion having a second arcuate engagement surface, and a second interface;
   a flexible heat transfer pad;
   a power component;
   the power component coupled to the flexible heat transfer pad, such that the flexible heat transfer pad substantially surrounds the power component;
   the first clamping portion and the second clamping portion configured to be coupled, such that the first arcuate engagement surface and the second arcuate engagement surface form an opening contoured to receive the power component; and
   the first interface and second interface are adjacent to each other.

2. The apparatus of claim 1, wherein the power component is cylindrical.

3. The apparatus of claim 1, wherein the power component is a capacitor.

4. The apparatus of claim 1, wherein the first clamping portion and the second clamping portion include a plurality of arcuate engagement surfaces.

5. The apparatus of claim 1, further comprising a heat sink coupled to at least one of the first clamping portion and the second clamping portion.

6. The apparatus of claim 5, wherein the heat sink is mechanically coupled to an enclosure.

7. The apparatus of claim 1, wherein the first clamping portion includes a first attachment opening and the second clamping portion includes a second attachment opening, the plurality of attachment openings extending axially along an axis perpendicular to the first arcuate engagement surface and the second arcuate engagement surface.

8. The apparatus of claim 7, wherein the plurality of attachment openings are contoured to receive an attachment device, the attachment device configured to extend axially through the first attachment opening and the second attachment opening.

9. The apparatus of claim 8, wherein the attachment device is a bolt.

10. The apparatus of claim 1, wherein the first arcuate engagement surface and the second arcuate engagement surface include a plurality of grooves.

11. A power capacitor heat-dissipating clamping device comprising:
    a first clamping portion integrally formed with a heat sink, the first clamping portion having a first generally arcuate engagement surface, and a first interface;
    a second clamping portion, the second clamping portion having a second generally arcuate engagement surface, and a second interface;
    a flexible heat transfer pad;
    a cylindrical power component;
    the power component coupled to the flexible heat transfer pad, such that the flexible heat transfer pad substantially surrounds the power component;
    the first clamping portion and the second clamping portion configured to be coupled, such that the first arcuate engagement surface and the second arcuate engagement surface form an opening contoured to receive the power component; and
    the first interface and second interface are adjacent to each other.

12. The device of claim 11, wherein the first clamping portion and the heat sink are integrally cast.

13. The device of claim 11, wherein the power component is a capacitor.

14. The device of claim 11, further comprising a gasket, the gasket applied to a mounting surface of the heat sink.

15. The device of claim 14, wherein the heat sink is mechanically coupled to a separate structure.

* * * * *